United States Patent
Liang et al.

(10) Patent No.: US 8,467,633 B2
(45) Date of Patent: Jun. 18, 2013

(54) WAVELENGTH CONVERSION STRUCTURE AND LIGHT SOURCE APPARATUS

(75) Inventors: Ji-Hao Liang, Tokyo (JP); Teruo Koike, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 13/211,359

(22) Filed: Aug. 17, 2011

(65) Prior Publication Data

US 2012/0051377 A1 Mar. 1, 2012

(30) Foreign Application Priority Data

Aug. 25, 2010 (JP) ................................ 2010-188333
Jun. 7, 2011 (JP) ................................ 2011-127327

(51) Int. Cl.
*G02F 1/01* (2006.01)
*G02F 1/35* (2006.01)
*H01S 3/04* (2006.01)
*B05B 5/00* (2006.01)
*H01L 25/00* (2006.01)
*G01T 1/20* (2006.01)

(52) U.S. Cl.
USPC .............. 385/1; 372/36; 372/43.01; 359/326; 427/157; 136/243; 136/244; 136/245; 136/246; 136/247; 136/248; 136/249; 136/250; 136/251; 136/252; 136/253; 136/254; 136/255; 136/256; 136/257; 136/258; 136/259; 250/370.11

(58) Field of Classification Search
USPC .... 385/1; 136/243–259; 250/370.11; 372/36, 372/43.01; 359/326; 427/157
See application file for complete search history.

(56) References Cited

U.S. PATENT DOCUMENTS

| | | | | |
|---|---|---|---|---|
| 5,500,054 A | * | 3/1996 | Goldstein | 136/253 |
| 6,118,908 A | * | 9/2000 | Bischel et al. | 385/14 |
| 7,040,774 B2 | * | 5/2006 | Beeson et al. | 362/84 |
| 7,361,938 B2 | * | 4/2008 | Mueller et al. | 257/94 |
| 7,380,962 B2 | * | 6/2008 | Chaves et al. | 362/293 |
| 7,450,311 B2 | * | 11/2008 | Erchak et al. | 359/634 |
| 7,565,050 B2 | * | 7/2009 | Lee et al. | 385/133 |
| 2010/0046234 A1 | * | 2/2010 | Abu-Ageel | 362/308 |
| 2012/0224378 A1 | | 9/2012 | Koike et al. | |

FOREIGN PATENT DOCUMENTS

| | | |
|---|---|---|
| JP | 4054594 B2 | 12/2007 |
| JP | 4158012 B2 | 10/2008 |
| JP | 2010-024278 A | 2/2010 |

OTHER PUBLICATIONS

U.S. Appl. No. 13/409,676; First Named Inventor: Teruo Koike; Title: "Wavelength Converting Member and Light Source Device"; Filed: Mar. 1, 2012.

* cited by examiner

*Primary Examiner* — Brian Healy
*Assistant Examiner* — Guy Anderson
(74) *Attorney, Agent, or Firm* — Holtz, Holtz, Goodman & Chick, P.C.

(57) ABSTRACT

A wavelength conversion structure includes a light guide formed of a light-transmissive member having a laser light incident port that allows the laser light to be introduced and a phosphor-containing layer that covers at least part of the surface of the light guide. The light guide has a light diffusing structure having asperities and a light reflecting film. The asperities are formed over the surface of the light guide except a laser light incident surface having the laser light incident port. The light reflecting film is formed over the surface of the light guide along the asperities except the laser light incident port and the portion covered with the phosphor-containing layer.

9 Claims, 13 Drawing Sheets

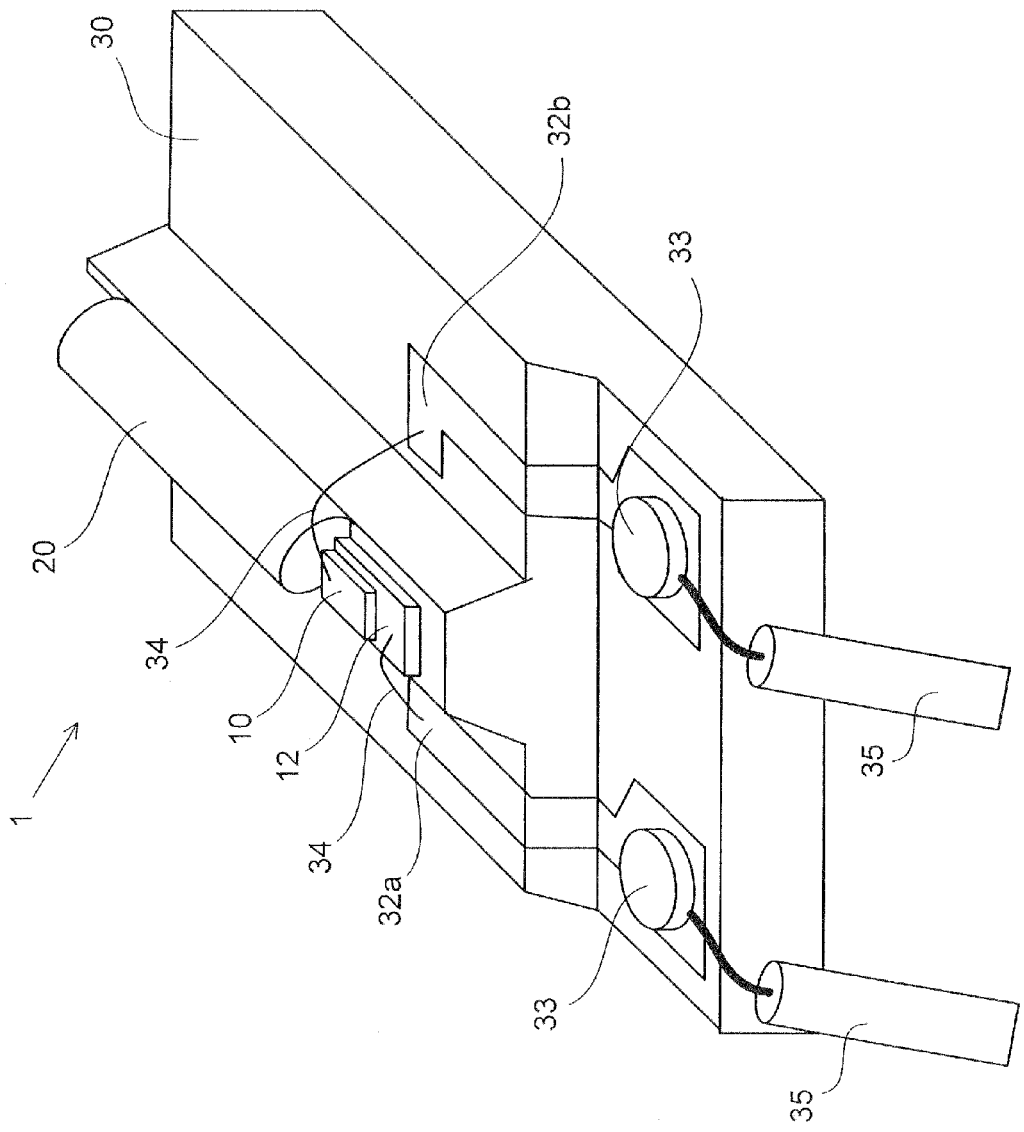

WAVELENGTH CONVERSION STRUCTURE AND LIGHT SOURCE APPARATUS

BACKGROUND OF THE INVENTION

1. Technical Field

The present invention relates to a light source apparatus using laser light.

2. Description of the Related Art

Converting electricity into light more efficiently and emitting a greater amount of light than a light emitting diode (LED), a semiconductor laser is expected to be used as a light source for a projector, a headlight for an automobile, and other high-intensity white light sources.

Japanese Patent No. 4,054,594 (hereinafter also referred to as Patent Document 1) discloses a light source apparatus so configured that laser light emitted from a laser diode is focused onto a phosphor or fluorophore, which emits incoherent, spontaneously emitted light. The light source apparatus includes a visible light reflecting mirror having a parabolic reflection surface open toward a predetermined direction and a laser light reflecting mirror provided at the focal point of the visible light reflecting mirror and reflecting the laser light having passed through the phosphor back toward the phosphor.

Since laser light has intense power and a small spot size, its optical energy density is very high. Laser light could therefore damage human eyes. Light emitted from a typical semiconductor laser, which emits light having a small spot size, is focused into a microscopic spot on the retina and generates heat locally on the retina. Further, laser light having a visible wavelength and an eyeball or retina tissue on which the laser light is incident could undergo a biochemical reaction. In this case, the retina can be damaged even when the total amount of optical power is small.

In a white light source apparatus including a blue laser in combination with a phosphor, the phosphor is dispersed in a binder typically made of a silicone resin or any other material. The phosphor-containing resin typically has a smooth surface, which forms a reflection surface. Laser light directed toward the phosphor may not be absorbed by the phosphor but can be reflected by the surface of the binder resin. If the reflected light is focused through an optical system, the focused light may have a spot size equal to the spot size at the exit of the laser and could hence damage human eyes.

The invention has been made in view of the problems described above, and an object of the invention is to provide a light source apparatus having what is called an eye-safety function that ensures safety of human eyes, and another object of the invention is to provide a wavelength conversion structure used in the light source apparatus.

A wavelength conversion structure according to the invention is a wavelength conversion structure into which laser light is introduced and which outputs light having a wavelength different from the wavelength of the laser light. The wavelength conversion structure comprises a light guide formed of a light-transmissive member having a laser light incident port that allows the laser light to be introduced and a phosphor-containing layer that covers at least part of the surface of the light guide. The light guide has a light diffusing structure having asperities formed over the surface of the light guide except a laser light incident surface having the laser light incident port and a light reflecting film formed over the surface of the light guide along the asperities except the laser light incident port and the portion covered with the phosphor-containing layer.

A light source apparatus according to the invention comprises any of the wavelength conversion structures and a semiconductor laser provided adjacent to the wavelength conversion structure. The semiconductor laser is so disposed that a laser light exiting surface thereof faces the laser light incident port.

The wavelength conversion structure and the light source apparatus according to the invention are not dangerous to human eyes.

BRIEF DESCRIPTION OF THE DRAWINGS

FIG. 1 is a perspective view showing the configuration of a light source apparatus according to a first embodiment of the invention;

DETAILED DESCRIPTION OF THE INVENTION

Figure 2A:
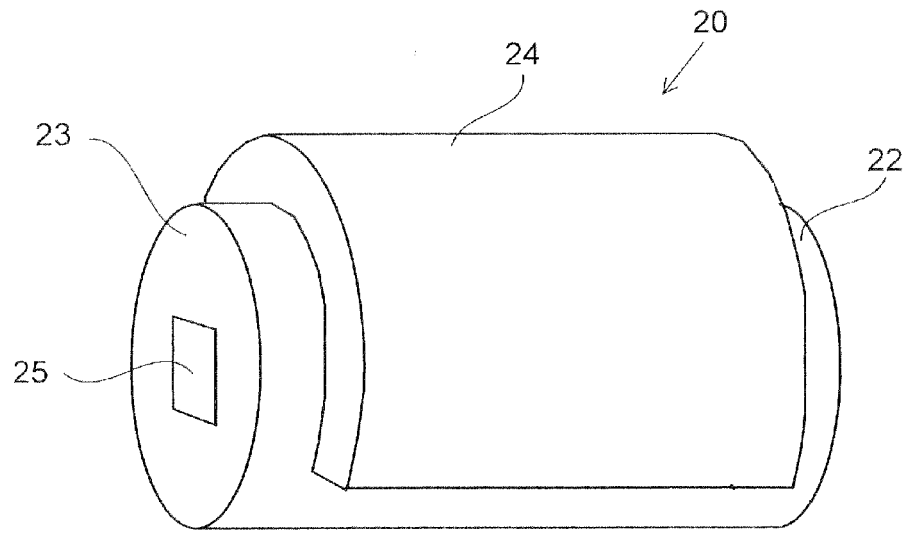
FIGS. 2A and 2B are a perspective view and a top view showing the configuration of a wavelength conversion structure according to the first embodiment of the invention, respectively.

Light source apparatus according to embodiments of the invention will be described below with reference to the attached drawings. In the following drawings, substantially the same or equivalent components and portions have the same reference characters.

First Embodiment

Figure 2B:
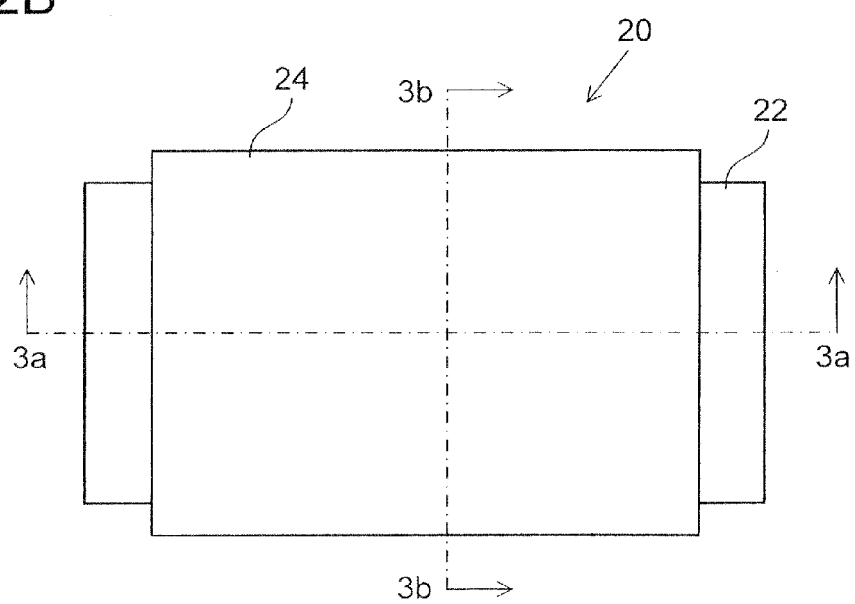
Figure 3A:
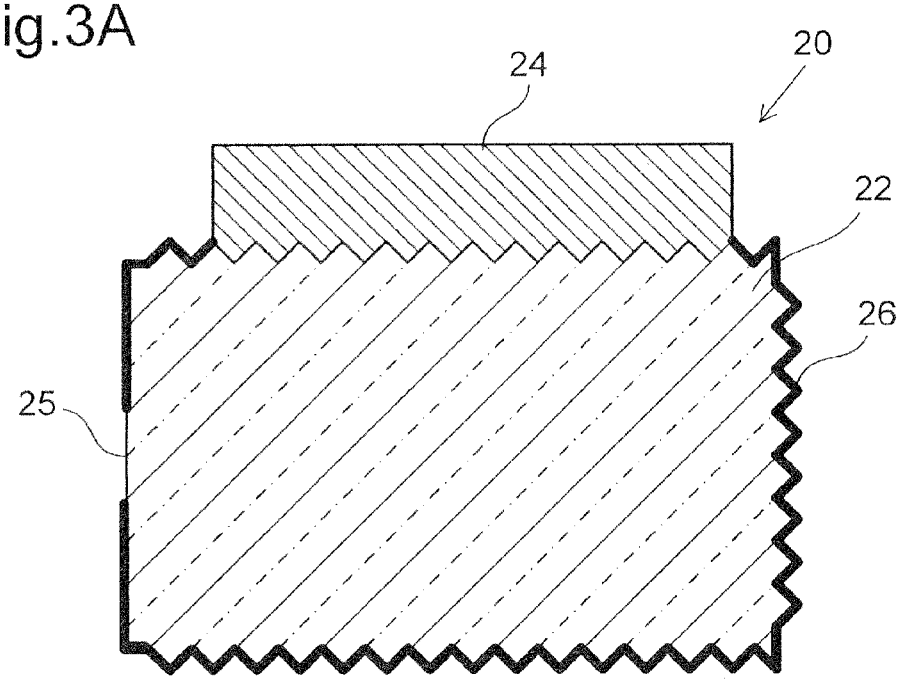
FIGS. 3A and 3B are cross-sectional views taken along the lines 3a-3a and 3b-3b in FIG. 2B, respectively.
Figure 3B:
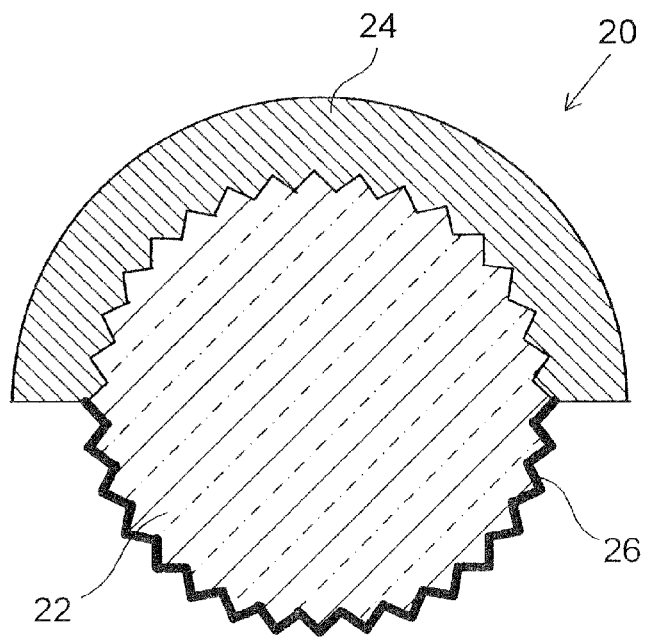

A light source apparatus according to a first embodiment of the invention will be described below. FIG. 1 is a perspective view showing the configuration of a light source apparatus 1 according to the first embodiment of the invention. FIGS. 2A and 2B are a perspective view and a plan view showing the configuration of a wavelength conversion structure 20 that forms part of the light source apparatus 1, respectively. FIGS. 3A and 3B are cross-sectional views taken along the lines 3a-3a and 3b-3b in FIG. 2B, respectively.

A laser diode 10 is an edge-emitting semiconductor laser including a semiconductor layer made of GaN or any other suitable nitride-based semiconductor and emitting blue light having a wavelength of about 450 nm through an end surface or facet of a semiconductor chip. The laser diode 10 has a top-surface electrode provided over a principal surface thereof, and no laser light is emitted through the principal surface. The laser diode 10 is mounted on a sub-mount 12 made of a ceramic or any other suitable material. The sub-mount 12, on which the laser diode 10 is mounted, is mounted on an upper surface of a heat sink base 30. On the surface of the sub-mount 12 is formed a conductor wiring line (not shown) electrically connected to a back-surface electrode of the laser diode 10. The conductor wiring line is electrically connected to a first electrode 32a provided on the heat sink base 30 via a bonding wire 34. The top-surface electrode provided over the principal surface of the laser diode 10 is also electrically connected to a second electrode 32b provided on the heat sink base 30 via another bonding wire 34. The first electrode 32a and the second electrode 32b correspond to a p-type electrode and an n-type electrode of the laser diode 10, respectively. A fixture 33 for fixing a lead wire 35 is provided at an end of each of the first electrode 32a and the second electrode 32b. The lead wires 35 are wiring lines for feeding electricity to the laser diode 10. The heat sink base 30 is made of Cu, Al, or any other material having high heat conductivity. The first electrode 32a and the second electrode 32b are provided on the heat sink base 30 with insulating films therebetween.

The wavelength conversion structure 20 is disposed adjacent to the laser diode 10. The wavelength conversion structure 20 includes a light guide 22 formed of a light-transmissive cylindrical glass member and a phosphor-containing resin 24 that partially covers the side surface of the light guide 22. The phosphor-containing resin 24 forms a light extracting surface that converts the wavelength of the laser light introduced into the light guide 22 and allows the converted light to exit out of the wavelength conversion structure 20.

The wavelength conversion structure 20 is so disposed that a laser light incident end surface 23 thereof having a laser light incident port 25 faces a laser light exiting facet of the laser diode 10. That is, the wavelength conversion structure 20 is so disposed that the longitudinal direction of the light guide 22 (height direction of cylinder or cylinder axis direction) coincides with the optical axis direction of the laser light. In particular, to form a lighting device in which the light output from the light source apparatus 1 is so configured with a reflection mirror and/or a projection lens that the resulting light has a predetermined light distribution pattern, the light source apparatus 1 and an optical system including the reflection mirror and/or the projection lens are preferably small because the size of the lighting device can be reduced. Further, arranging the wavelength conversion structure 20 and the laser diode 10 adjacent to each other allows the size of the light source apparatus 1 to be compact and the time of flight of the laser light required to reach the wavelength conversion structure 20 to be shortened. Specifically, the dimensions of the heat sink base 30 may be about 20 mm in transverse length and at least 30 mm to 40 mm or smaller in longitudinal length, and the light exiting facet of the laser diode 10 and the wavelength conversion structure 20 may be in contact with each other or the distance therebetween may be 5 mm or smaller.

The light guide 22 has microscopic asperities (or projections and depressions) over its surface except on the laser light incident end surface 23. The asperities are formed by blasting or otherwise randomly roughening the target surface. The asperities may alternatively have a conical shape, a pyramidal shape, or any other regular shape formed by using photolithography. The depth of the asperities ranges from at least 100 nm to 5 μm or smaller, preferably 500 nm, which is equivalent to the wavelength of the laser light. The size of each of the projections that form the asperities over the surface of the light guide 22 is preferably 10 times the wavelength of the laser light or smaller and the aspect ratio of the projection is preferably at least 0.5.

The surface of the light guide 22 is covered with a light reflecting film 26 except the portion where the laser light incident port 25 is formed and the portion on which the phosphor-containing resin 24 is formed. The light reflecting film 26 is made of a material having high reflectance and high heat conductivity, for example, Ag, Al, or any other suitable metal, or a Ba-based oxide. The light reflecting film 26 is formed on the surface of the light guide 22 along the asperities so as to form a light reflecting surface along the asperities. The laser light incident port 25 of the light guide 22 is located in a central portion of the laser-light incident end surface 23 and is not covered with the light reflecting film, but the glass material of the light guide 22 is exposed to the atmosphere through the laser light incident port 25. The laser light emitted from the laser diode 10 is introduced through the laser light incident port 25 into the light guide 22. The position, the shape, and the size of the laser light incident port 25 can be set as appropriate in consideration of the spot size of the laser light, the positional relationship between the laser diode 10 and the light guide 22, and other factors.

The light reflecting film 26, which forms the light reflecting surface over the interface with the light guide 22, prevents the laser light introduced into the light guide 22 from exiting out of the light guide 22 through the portions other than the surface of the phosphor-containing resin 24. That is, the laser light introduced into the light guide 22 exits out of the light guide 22 only through the phosphor-containing resin 24. The combination of the asperities formed over the surface of the light guide 22 and the light reflecting film 26 forms a light diffusing structure over the surface of the light guide 22.

The phosphor-containing resin 24 is obtained by dispersing a YAG:Ce phosphor in a silicone resin or any other suitable light-transmissive resin. The phosphor absorbs the blue light emitted from the laser diode 10 and having a wavelength of about 450 nm and converts the blue light into yellow light having a light emission peak, for example, at about 560 nm. The yellow light produced by the phosphor in the wavelength conversion is mixed with the blue light not having undergone the wavelength conversion but having just passed through the phosphor-containing resin 24, whereby white light is obtained through the surface of the phosphor-containing resin 24. The diameter of the phosphor is 10 μm or smaller, preferably 5 μm or smaller.

The phosphor-containing resin 24 is formed along a curved shape of the side surface of the light guide 22. The phosphor-containing resin 24 is formed within a range corresponding to a central angle of 180° along the side surface of the light guide 22, as shown in FIG. 3B. That is, the phosphor-containing resin 24 continuously covers about one-half the side surface of the light guide 22, and white light exits from this range. The thickness of the phosphor-containing resin 24 is, for example, about 100 μm.

Figure 4:
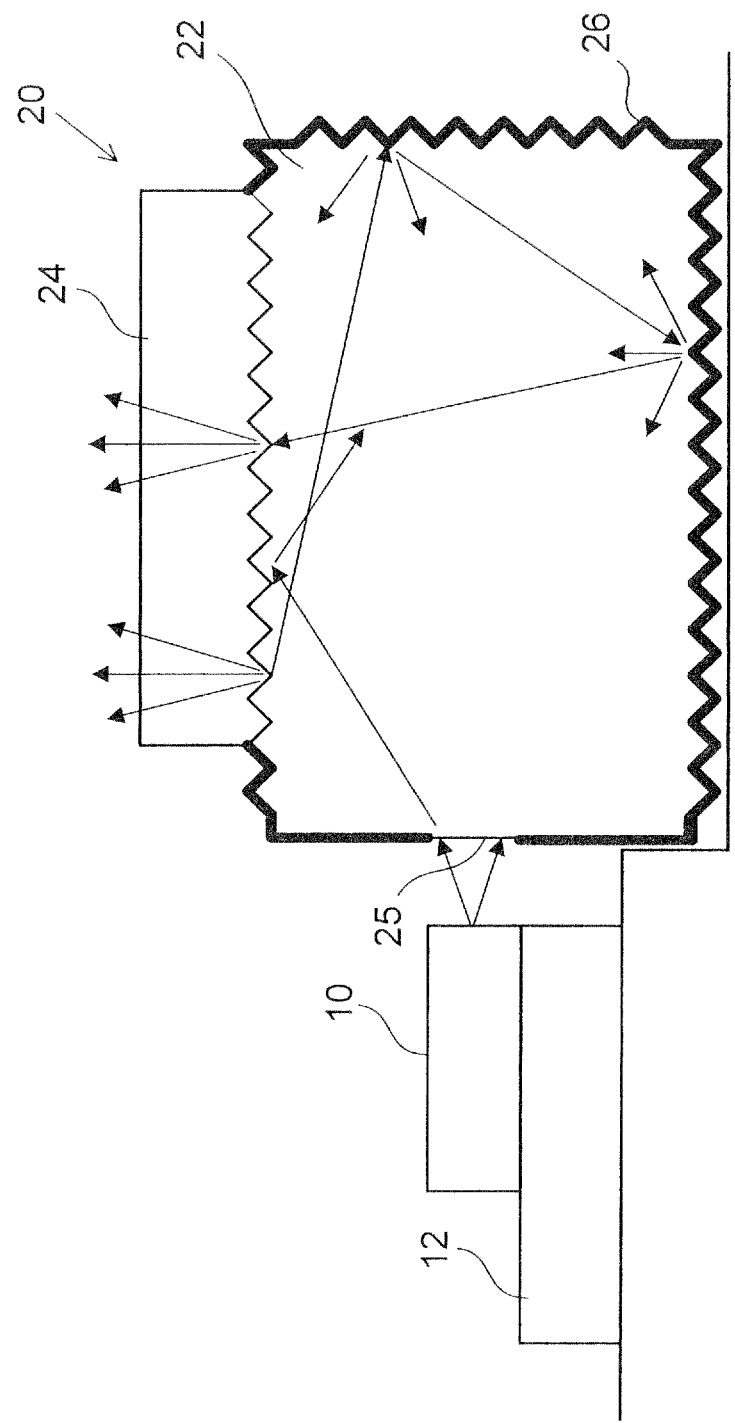
FIG. 4 is a cross-sectional view showing the principle of an eye safety function of the light source apparatus according to the first embodiment of the invention.

The principle of an eye safety function of the light source apparatus 1 according to the present embodiment will next be described with reference to FIG. 4. When electricity is fed to the laser diode 10 via the pair of lead wires 35, blue laser light having a wavelength of about 450 nm is emitted through the laser light exiting facet of the laser diode 10. The laser light is introduced through the laser light incident port 25 into the light guide 22.

The laser light introduced into the light guide 22 is diffused and scattered in random directions by the light diffusing structure, which is formed of the asperities and the light reflecting film 26 over the surface of the light guide 22, and guided to the phosphor-containing resin 24. The light diffusing structure of the light guide 22 can reduce the number of reflections of the laser light in the light guide 22, whereby high efficiency is achieved. Further, since the light diffusing structure diffuses and scatters the laser light in random directions in the light guide 22, the laser light can spread and impinge on the entire surface of the phosphor-containing resin 24. That is, light can be extracted through the entire surface of the phosphor-containing resin 24, whereby the light emitting area can be increased and no luminance unevenness will occur. In particular, when the asperities formed over the surface of the light guide 22 are so configured that each unit of the asperities has a size 10 times the wavelength of the laser light or smaller and has an aspect ratio of at least 0.5, luminance unevenness can be effectively prevented. Alternatively, each unit of the asperities can be provided to have a size or an aspect ratio different from those of the other units over the surface of the light guide 22, or the density of the asperities can be changed over the surface of the light guide 22. In this way, the luminance distribution over the light extracting surface can be adjusted.

If the surface of the light guide 22 is flat, the laser light introduced into the light guide 22 is repeatedly reflected in the light guide 22 and hence attenuated, resulting in a decrease in light emission efficiency. Further, in this case, the laser light concentrates on a specific portion of the phosphor-containing resin 24, and hence the light emitting area is reduced. Moreover, the light reflected by the flat surface produces interfering waves with high probability, sometimes resulting in luminance unevenness over the light extracting surface.

Since the exposed surface of the light guide 22 is all covered with the light reflecting film 26 except the laser light incident port 25, the laser light introduced into the light guide 22 is all introduced into the phosphor-containing resin 24. In other words, the laser light introduced into the light guide 22 through the laser light incident port 25 always exits out of the light guide 22 via the phosphor-containing resin 24. The size of the laser light incident port 25 is preferably equal to or smaller than the size of the laser light exiting facet of the laser diode 10. This configuration can reduce the amount of leakage of the light diffused and scattered in random directions by the light diffusing structure, which is formed of the asperities and the light reflecting film 26 over the surface of the light guide 22, through the laser light incident port 25.

The laser light introduced into the phosphor-containing resin 24 produces new wavefronts because the laser light is incident on the phosphor particles and diffracted by them. In other words, each of the phosphor particles can be considered as a new light source. The light beams diffracted by the phosphor particles form incoherent light, from which any optical system, no matter how precise, cannot restore the light with the spot diameter of the laser light emitted from the laser diode 10. That is, when the laser light passes through the phosphor-containing resin 24, the beam spot size is enlarged to a size corresponding to the phosphor-containing resin 24. When the beam spot size is large enough, the laser light is not dangerous to human eyes any more or eye safety is achieved.

The phosphor absorbs the blue light emitted from the laser diode 10 and having a wavelength of about 450 nm and converts the blue light into the yellow light having a light emission peak, for example, at about 560 nm, as described above. The yellow light produced by the phosphor in the wavelength conversion is mixed with the blue light not having undergone the wavelength conversion but having just passed through the phosphor-containing resin 24, whereby the light that exits through the surface of the phosphor-containing resin 24 is recognized as white light. That is, the blue laser light emitted from the laser diode 10 is extracted as incoherent white light through the entire surface of the phosphor-containing resin 24.

Figure 5:
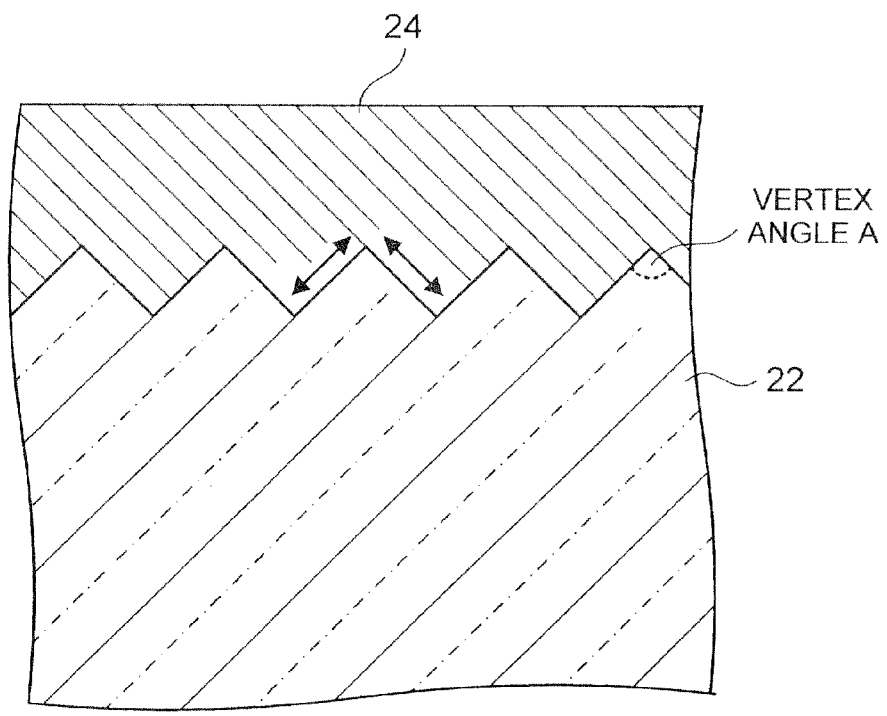
FIG. 5 is a cross-sectional view of the wavelength conversion structure according to the first embodiment of the invention.

FIG. 5 is an enlarged view of the vicinity of the interface between the light guide 22 and the phosphor-containing resin 24. Forming the asperities over the surface of the light guide 22 increases the surface area of the light guide 22 and improves the adhesion between the light guide 22 and the phosphor-containing resin 24.

On the other hand, since the phosphor-containing resin 24 absorbs optical energy and generates heat in the wavelength conversion process, the temperature of the phosphor-containing resin 24 greatly changes. The phosphor-containing resin 24 therefore repeats expansion and contraction due to the change in temperature. If the surface of the light guide 22 is flat, the phosphor-containing resin 24 tends to separate off the light guide 22 due to the difference in coefficient of thermal expansion between the light guide 22 and the phosphor-containing resin 24. That is, if the surface of the light guide 22 is flat, thermal stresses induced over the interface between the light guide 22 and the phosphor-containing resin 24 act in a direction in which they are enhanced with each other over the interface, resulting in vulnerability to thermal shock.

When the asperities are provided over the surface of the light guide 22 and the phosphor-containing resin 24 is formed to cover the asperities as in the present embodiment, thermal stresses induced over the interface between the light guide 22 and the phosphor-containing resin 24 act in the directions along the asperities of the surface, as indicted by the arrows in FIG. 5. That is, the thermal stresses do not act to interfere with each other over the interface. As a result, the phosphor-containing resin 24 does not tend to separate off the light guide 22. In particular, when each of the projections that form the surface asperities has a conical shape, a pyramidal shape, or any other regular shape, and the vertex angle A of each of the projections is smaller than or equal to 90°, thermal stresses are completely separated from each other over the interface, and resistance to thermal shock is therefore greatly increased.

As described above, forming the asperities over the surface of the light guide 22 and forming the phosphor-containing resin 24 to cover the asperities allow the adhesion between the light guide 22 and the phosphor-containing resin 24 and the resistance to thermal shock to be improved.

A method for manufacturing the wavelength conversion structure 20 according to the embodiment of the invention will next be described. FIGS. 6A to 6D are cross-sectional views showing steps of manufacturing the wavelength conversion structure 20.

Figure 6A:
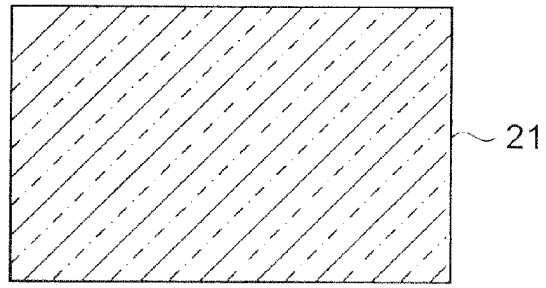
FIGS. 6A to 6D are cross-sectional views showing steps of manufacturing the wavelength conversion structure according to the first embodiment of the invention.

A glass member 21 that will form the light guide 22 is first provided. The glass member 21 has a cylindrical shape having a diameter ranging from 0.2 to 1.0 mm and a length (or height) ranging from 1.0 to 5.0 mm. The shape of the glass member 21 is not limited to cylindrical but the glass member 21 may alternatively have a prism shape. Further, the light guide 22 is not necessarily made of glass but may alternatively be made of a silicone resin, an epoxy resin, or any other suitable light-transmissive resin. Further, the light guide 22 may alternatively have a tubular structure that is internally hollow (FIG. 6A). When the light source apparatus 1 is used in a headlamp of a vehicle, the glass member 21 preferably has a cylindrical shape having a diameter ranging from 0.3 to 2.0 mm and a length ranging from 0.3 to 6.0 mm with the length being greater than the diameter (i.e., diameter<length). The thus configured light emitting portion can be smaller and more intense than a halogen lamp and an HID lamp having been used as a light source of a headlamp. Further, the glass member 21 is desirably so configured that diameter:length=1:2 to 1:6 for low beam use and diameter:length=1:2 to 1:4 for high beam use. The reason for this is that the bright-dark boundary can be smoothly defined by setting the diameter of the glass member 21 for low beam use to a value smaller than that for high beam use.

Figure 6B:
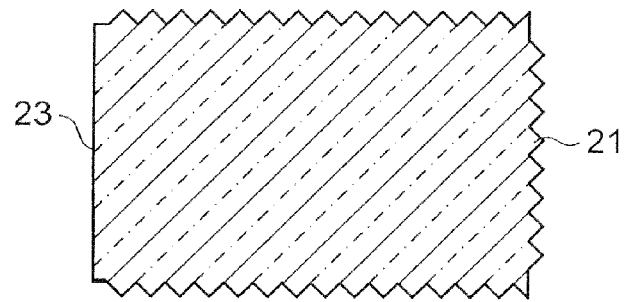

Next, the surface of the glass member 21 except the laser-light incident end surface 23 is roughened. Specifically, a mask that covers the laser-light incident end surface 23 of the glass member 21 is formed, and randomly shaped asperities are formed over the surface of the glass member 21 by blasting the glass member 21 with metallic or ceramic particles. To effectively diffuse and scatter laser light at the surface with asperities, the depth of the asperities preferably substantially agrees with the wavelength of the laser light. When a blue laser is used, the depth of the asperities is preferably about 500 nm and the aspect ratio of each of the projections that form the asperities is preferably 0.5 or more. The asperities may alternatively be formed to have a regular shape and arrangement by using known photolithography (FIG. 6B). The roughening may be performed in installments, under different conditions for target regions to be roughened, or by patterning a mask used in the photolithography so that asperities having non-uniform sizes or aspect ratios are formed over the surface of the glass member 21.

Figure 6C:
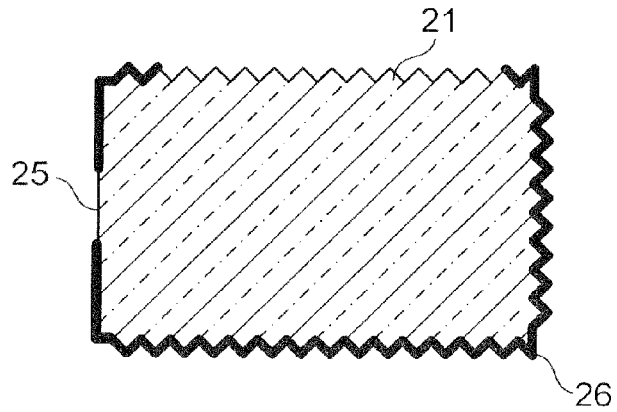

After the portion where the laser light incident port 25 will be formed and the portion where the phosphor-containing resin 24 will be formed are covered with a mask, a metallic film made of Ag, Al, or any other suitable substance is deposited on the surface of the glass member 21 in an evaporation process. The light reflecting film 26 and the laser light incident port 25 are thus formed on the surface of the glass member 21. The light reflecting film 26 formed over the surface of the glass member 21 along the asperities forms the light diffusing structure. No light reflecting film 26 is formed in the laser light incident port formation portion or the phosphor-containing resin formation portion, which have been covered with the mask. In those portions, the glass member 21 is exposed to the atmosphere. The light reflecting film 26 may alternatively be formed by selectively applying a Ba-based oxide onto the surface of the glass member 21 (FIG. 6C).

Figure 6D:
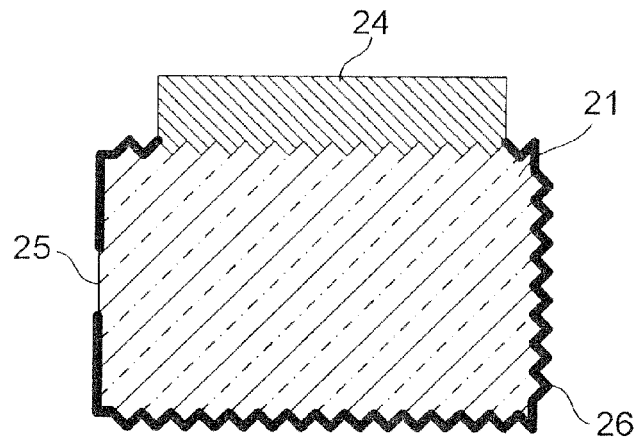

The phosphor-containing resin 24 obtained by dispersing a YAG:Ce phosphor in a silicone resin is then applied onto the phosphor-containing resin formation portion, the portion of the surface of the glass member 21 where no light reflecting film 26 has been formed. The phosphor-containing resin 24 is formed along the curved shape of the side surface of the cylindrical light guide 22. The phosphor-containing resin 24 is formed, for example, within a range corresponding to a central angle of 180° along the side surface of the glass member 21. Heat treatment is then performed to cure the phosphor-containing resin 24. Since the phosphor-containing resin 24 is formed over the asperities of the surface of the glass member 21, the adhesion between the glass member 21 and the phosphor-containing resin 24 is ensured (FIG. 6D).

The wavelength conversion structure 20 is completed by carrying out the steps described above. The wavelength conversion structure 20 is so mounted on the heat sink base 30 that the laser-light incident end surface 23 thereof having the laser light incident port 25 faces the laser light exiting facet of the laser diode 10.

As apparent from the above description, in the light source apparatus according to the embodiment of the invention, the laser light emitted from the laser diode 10 is introduced into the light guide 22, always passes through the phosphor-containing resin 24, and exits out of the light source apparatus. That is, laser light reflected by the surface of the phosphor-containing resin 24 will not exit out of the apparatus in the form of laser light. The laser light having passed through the phosphor-containing resin 24 is diffracted by the phosphor particles to produce new wavefronts. That is, each of the phosphor particles can be considered as a new light source. The light beams diffracted by the phosphor particles form incoherent light, from which any optical system, no matter how precise, cannot restore the spot diameter of the laser light emitted from the laser diode 10. That is, having passed through the phosphor-containing resin 24, the laser light is no longer dangerous to human eyes.

Since the light diffusing structure formed of the surface having asperities and the light reflecting film 26 is formed over the surface of the light guide 22, the laser light introduced into the light guide 22 will not be repeatedly reflected in the light guide 22, whereby high light emission efficiency is achieved. Further, since the light diffusing structure diffuses and scatters the laser light in random directions, the laser light introduced into the light guide 22 can be extracted through the entire surface of the phosphor-containing resin 24, whereby the light emitting area can be increased and no luminance unevenness will occur.

Further, since the phosphor-containing resin 24 is formed over the surface having asperities of the light guide 22, the adhesion between the phosphor-containing resin 24 and the light guide 22 is ensured and hence resistance to thermal shock can be improved.

Second Embodiment

Figure 7A:
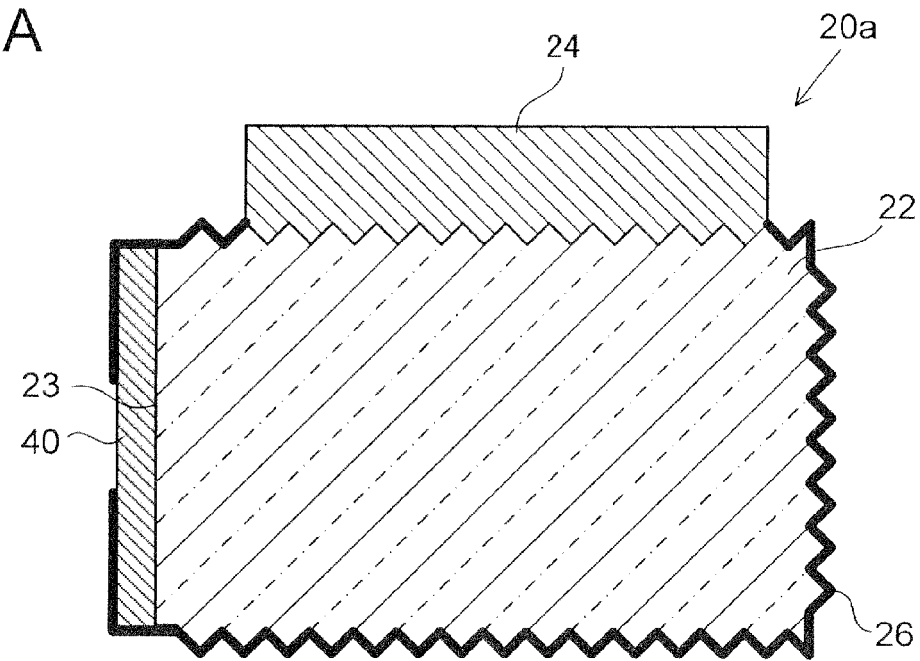
FIGS. 7A and 7B are cross-sectional views showing the configuration of a wavelength conversion structure according to a second embodiment of the invention.

FIG. 7A is a cross-sectional view showing the configuration of a wavelength conversion structure 20a according to a second embodiment of the invention. The wavelength conversion structure 20a differs from the wavelength conversion structure 20 according to the first embodiment described above in that a polarization filter 40 for blocking return light directed to the laser diode 10 is provided adjacent to the laser-light incident end surface 23 of the light guide 22.

The polarization filter 40 transmits only light having an amplitude component polarized in a specific direction. The polarization filter 40 is designed to transmit linearly polarized laser light emitted from the laser diode 10 and directed toward the light guide 22. The laser light introduced into the light guide 22 is diffused and scattered by the light diffusing structure formed over the surface of the light guide 22 so that the oscillating direction of the laser light is changed. Since the laser light having the changed oscillating direction cannot pass through the polarization filter 40, no light will return to the laser diode 10. If any return light is incident on the laser diode 10, the laser oscillation becomes unstable, possibly resulting in variation in output power. In contrast, attaching the polarization filter 40 to the laser light incident end surface 23 of the light guide 22 to block return light as in the present embodiment allows the laser diode 10 to output light in a stable manner.

Figure 7B:
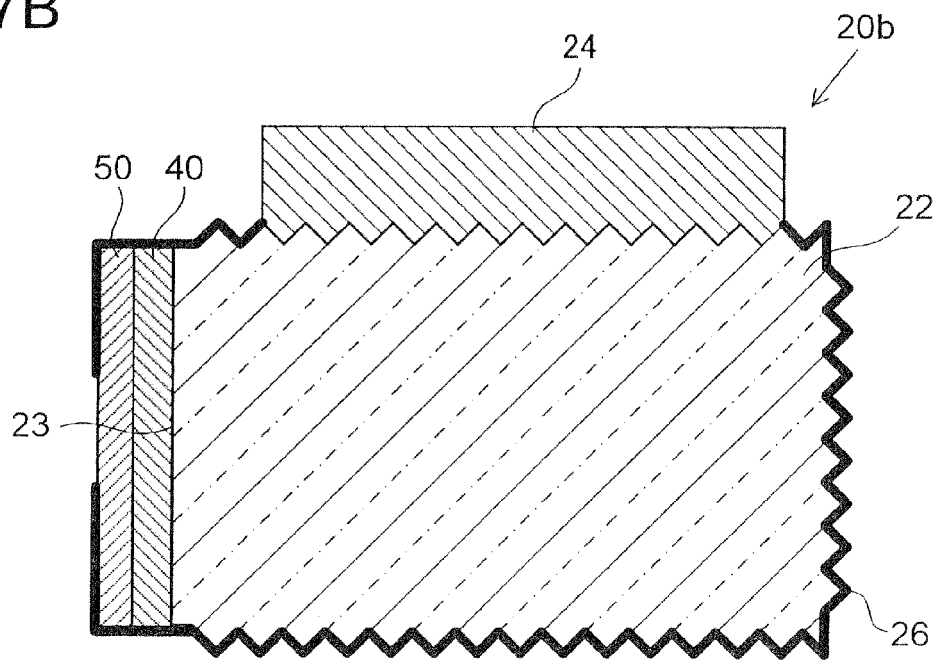

FIG. 7B is a cross-sectional view showing the configuration of a wavelength conversion structure 20b having improved return light blocking capability and improved transmittance of the laser light directed toward the light guide 22. The wavelength conversion structure 20b includes the polarization filter 40 provided adjacent to the laser light incident end surface 23 of the light guide 22 and an anti-reflection film 50 provided adjacent to the polarization filter 40. The anti-reflection film 50 is formed by alternately and repeatedly stacking two types of layer having different refractive indices. In the anti-reflection film 50, in which the thickness of each layer is set in accordance with the wavelength of the laser light, light beams reflected by the interface between a low refractive index layer and a high refractive index layer interfere destructively, whereas light beams directed toward the light guide 22 interfere constructively. Each low refractive index layer is formed, for example, of an $SiO_2$ film, and each high refractive index layer is formed, for example, of a $TiO_2$ film. These films can be formed by using vacuum evaporation or sputtering. The anti-reflection film 50 may not be used in combination with the polarization filter 40 but may alternatively be used alone. In this case, the anti-reflection film 50 is provided adjacent to the laser-light incident end surface 23 of the light guide 22.

Third Embodiment

Figure 8A:
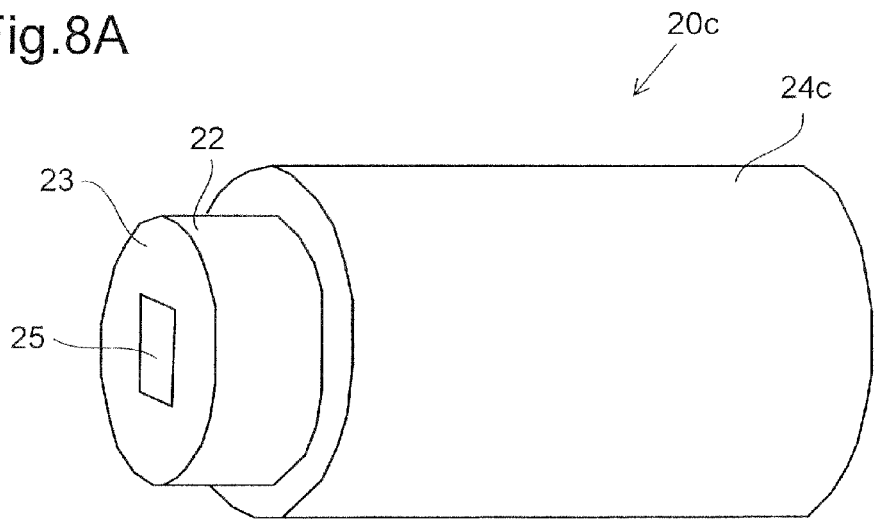
FIG. 8A is a perspective view showing the configuration of a wavelength conversion structure according to a third embodiment of the invention.
Figure 8B:
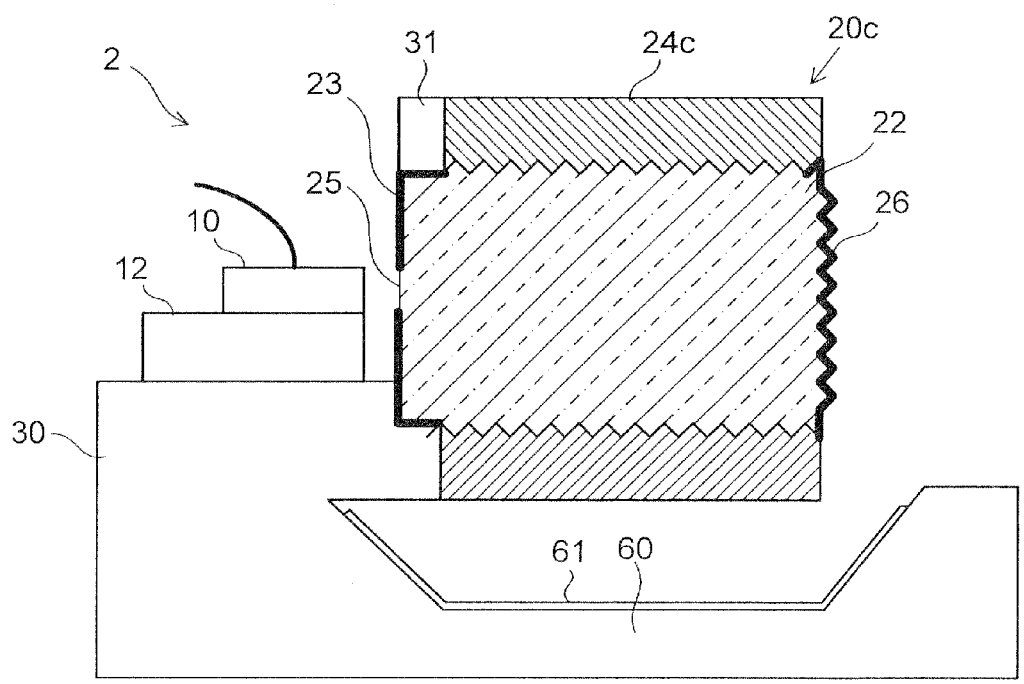
FIG. 8B is a cross-sectional view showing the configuration of a light source apparatus according to the third embodiment of the invention.

FIG. 8A is a perspective view showing the configuration of a wavelength conversion structure 20c according to a third embodiment of the invention, and FIG. 8B is a cross-sectional view showing the configuration of a light source apparatus 2 according to the third embodiment of the invention including the wavelength conversion structure 20c. The wavelength conversion structure 20c includes the cylindrical light guide 22 and a phosphor-containing resin 24c that covers the entire circumferential side surface of the light guide 22. That is, the phosphor-containing resin 24c has a cylindrical shape and accommodates the light guide 22 therein. In other words, the phosphor-containing resin 24c is formed within a range corresponding to a central angle of 360° along the side surface of the light guide 22. The light guide 22 has microscopic asperities over the surface thereof except the laser-light incident end surface 23, and the light reflecting film 26 is formed on the surface of the light guide 22 except the laser light incident port formation portion and the phosphor-containing resin formation portion. As described above, the wavelength conversion structure 20c according to the present embodiment has a structure that allows white light to exit in all directions along the circumferential side surface of the cylindrical light guide 22. The portion of the wavelength conversion structure 20c on the side where the laser-light incident end surface 23 is present is inserted into the fixed ring 31 so that the wavelength conversion structure 20c is located adjacent to the laser diode 10 and fixed like a cantilever with the laser light incident port 25 facing the laser light exiting facet. The wavelength conversion structure 20c may alternatively be fixed like a beam with both ends fixed.

The light source apparatus 2 includes a reflector 60 having a light reflecting film 61 under the wavelength conversion structure 20c. The light reflecting film 61 is provided in a position away from the outer circumferential surface of the wavelength conversion structure 20c (i.e., surface of the phosphor-containing resin 24c that covers the side surface of the light guide 22) and guides the light that exits from the wavelength conversion structure 20c upward. The reflector 60 can be formed integrally with the heat sick base 30, as shown in FIG. 8B.

The light source apparatus 2 according to the present embodiment can achieve not only the eye safety function but also substantially the same light distribution as that provided by a light source apparatus of related art using an incandescent lamp.

Fourth Embodiment

Figure 9:
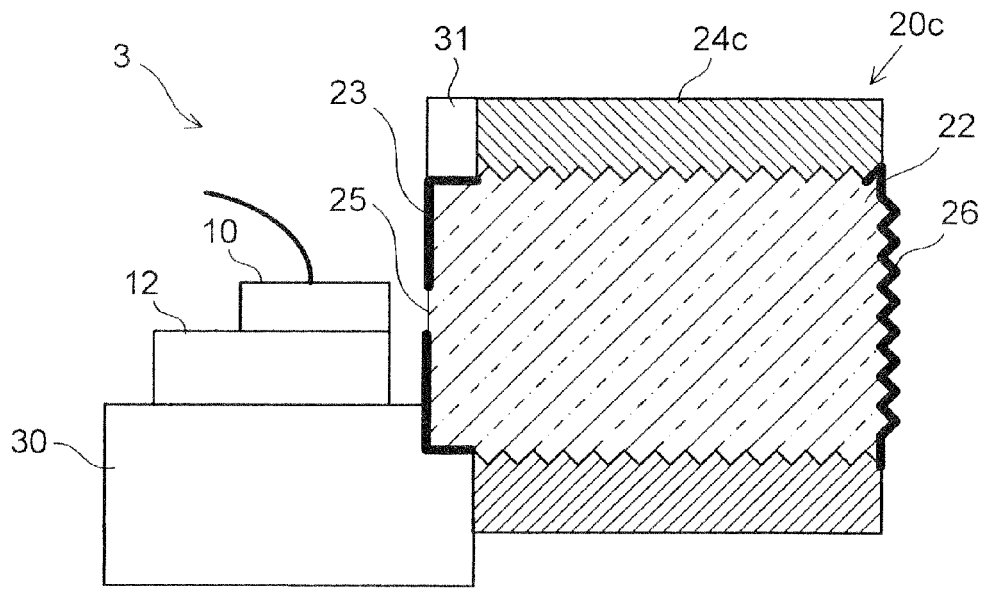
FIG. 9 is a cross-sectional view showing the configuration of a light source apparatus according to a fourth embodiment of the invention.

FIG. 9 is a cross-sectional view showing the configuration of a light source apparatus 3 according to a fourth embodiment of the invention. The wavelength conversion structure 20c is the same one as shown in the third embodiment described above. That is, the wavelength conversion structure 20c includes the cylindrical light guide 22 and the phosphor-containing resin 24c that covers the entire circumferential side surface of the light guide 22, as shown in FIG. 8A. The phosphor-containing resin 24c has a cylindrical shape and accommodates the light guide 22 therein. In other words, the phosphor-containing resin 24c is formed within a range corresponding to a central angle of 360° along the side surface of the light guide 22. The light guide 22 has microscopic asperities over the surface thereof except the laser-light incident end surface 23, and the light reflecting film 26 is formed on the surface of the light guide 22 except the laser light incident port formation portion and the phosphor-containing resin formation portion. As described above, the wavelength conversion structure 20c according to the present embodiment has a structure that allows white light to exit in all directions along the circumferential side surface of the cylindrical light guide 22. The portion of the wavelength conversion structure 20c on the side where the laser-light incident end surface 23 is present is inserted into the fixed ring 31 so that the wavelength conversion structure 20c is located adjacent to the laser diode 10 and fixed like a cantilever with the laser light incident port 25 facing the laser light exiting facet. The light source apparatus 3 according to the present embodiment differs from the light source apparatus 2 according to the third embodiment described above in that no reflector facing the side surface of the wavelength conversion structure 20c is provided. The light source apparatus 3 according to the present embodiment can achieve not only the eye safety function but also substantially the same light distribution as that provided by a light source apparatus of related art using an incandescent lamp.

Figure 10:
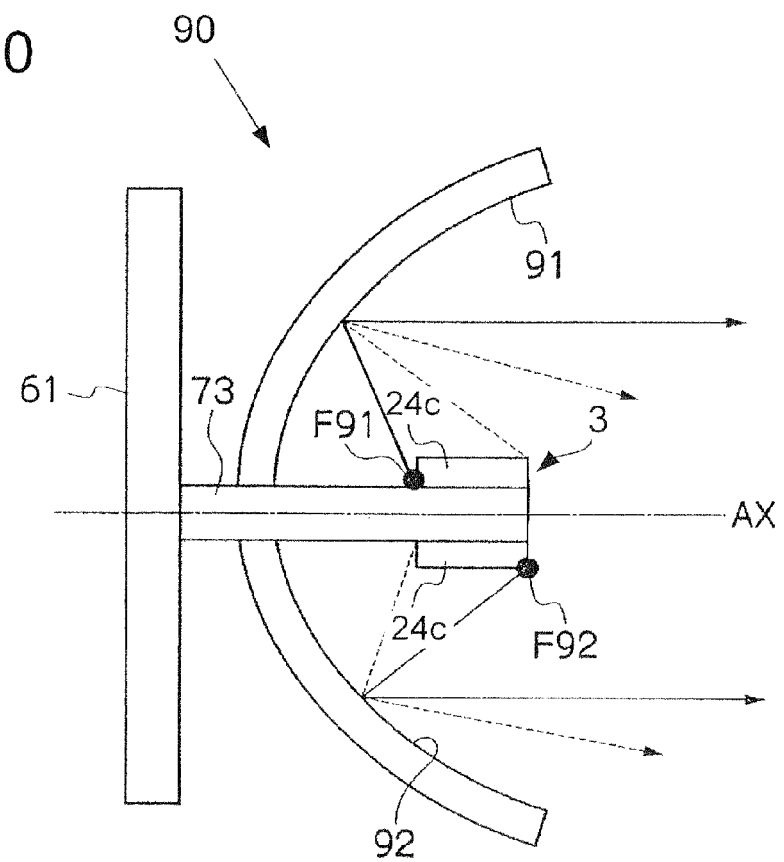
FIG. 10 is a cross-sectional view showing the configuration of a vehicle lighting device including the light source apparatus according to the fourth embodiment of the invention.

FIG. 10 is a cross-sectional view showing a schematic configuration of a reflector-type vehicle lighting device 90 including the light source apparatus 3 according to the fourth embodiment. The vehicle lighting device 90 includes the light source apparatus 3 disposed along an axis AX of a lighting device, an upper reflection surface 91, a lower reflection surface 92, a heat sink substrate 73 which is disposed along the axis AX of the lighting device and on which the light source apparatus 3 is mounted, and an lighting device housing 61.

The upper reflection surface 91 is so disposed above the light source apparatus 3 that it receives light exiting from an upper portion of the light source apparatus 3. The reflection surface 91 is, for example, a paraboloidal reflection surface having its focal point F91 set in the vicinity of the rear end of the light emitting region of the light source apparatus 3.

The lower reflection surface 92 is so disposed under the light source apparatus 3 that it receives light exiting from a lower portion of the light source apparatus 3. The reflection surface 92 is, for example, a paraboloidal reflection surface having its focal point F92 set in the vicinity of the front end of the light emitting region of the light source apparatus 3.

According to the thus configured vehicle lighting device 90, the light that exits from the light source apparatus 3 is reflected by the reflection surfaces 91 and 92 and directed forward in the light projection direction. A high beam light distribution pattern is thus formed on an imaginary vertical screen. Since the light source apparatus 3 used in the thus configured vehicle lighting device 90 has a compact configuration in which the wavelength conversion structure 20c and the laser diode 10 are disposed adjacent to each other, the vehicle lighting device has a small size in the optical axis direction.

Further, the thus configured vehicle lighting device 90 can achieve light distribution having a small amount of luminance and color unevenness because the light diffusing structure formed by combining the asperities and the light reflecting film in the wavelength conversion structure 20c increases the uniformity of the emitted light luminance distribution and the uniformity of the emitted light color in the light source apparatus 3. Moreover, since the laser diode that forms part of the light source apparatus 3 is an edge-emitting laser diode and the top surface of the laser diode is covered with a top-surface electrode, no laser light is emitted through the surfaces other than the laser light exiting facet. Since the laser light emitted through the laser light exiting facet always passes through the phosphor-containing resin 24c and exits out of the apparatus, the vehicle lighting device excels in eye safety capability.

Fifth Embodiment

Figure 11:
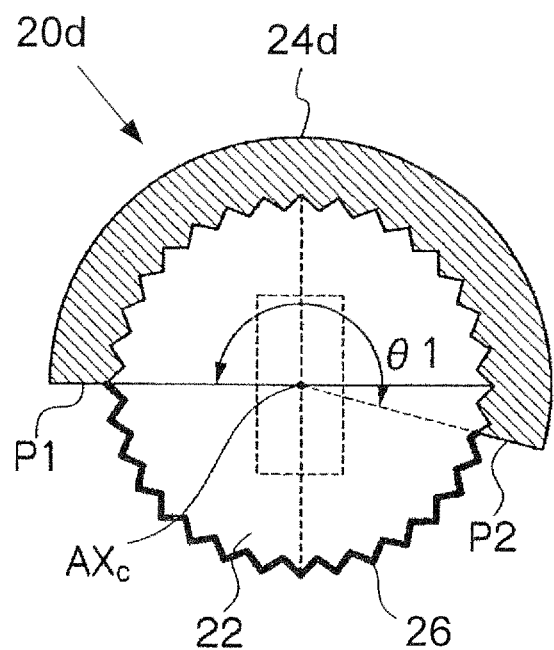
FIG. 11 is a cross-sectional view showing the configuration of a wavelength conversion structure that forms part of a light source apparatus according to a fifth embodiment of the invention.

FIG. 11 shows a wavelength conversion structure 20d that forms part of a light source apparatus according to a fifth embodiment of the invention and is a cross-sectional view showing a cross section perpendicular to the cylinder axis of the light guide 22. The wavelength conversion structure 20d includes a phosphor-containing resin 24d formed in a region located on the side surface of the light guide 22 and surrounded by a first flat plane P1 (horizontal plane) containing a cylinder axis $AX_c$ of the light guide 22 and a second flat plane P2 containing the cylinder axis $AX_c$ of the light guide 22 and inclined to the first flat plane P1 by a predetermined angle. The first embodiment has been described with reference to the case where the phosphor-containing resin is formed within a range corresponding to a central angle of 180° along the side surface of the light guide 22 (that is, the case where the first flat plane P1 and the second flat plane P2 make an angle of 180°), the phosphor-containing resin in the present embodiment is formed within a range corresponding to a central angle of 195° along the side surface of the light guide 22 (that is, the first flat plane P1 and the second flat plane P2 makes an angle θ1 of 195°). In other words, the phosphor-containing resin 24d is also provided in a region between the horizontal plane and a plane angularly shifted downward by 15°. The light source apparatus including the wavelength conversion structure 20d according to the present embodiment has a configuration in which the wavelength conversion structure is fixed like a cantilever as shown in FIG. 8B or 9. The other components are the same as those in the first embodiment, and no description thereof will therefore be made. The reason why the angle θ1 is set at 195° is to provide a shape on the left or right side including a region from the horizontal plane to a plane angularly inclined by 15°, which is defined in the standard of a low beam light distribution pattern. The angle θ1 can be changed as appropriate within an angular range suitable for a low beam light distribution for a vehicle lighting device.

Figure 12A:
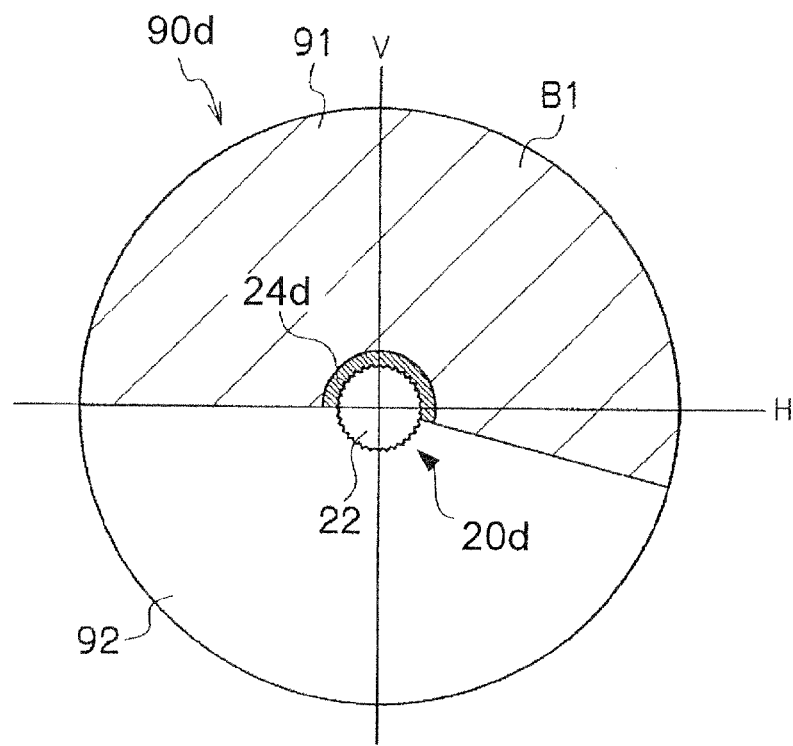
FIG. 12A is a front view showing the configuration of a vehicle lighting device including the light source apparatus according to the fifth embodiment of the invention.
Figure 12B:
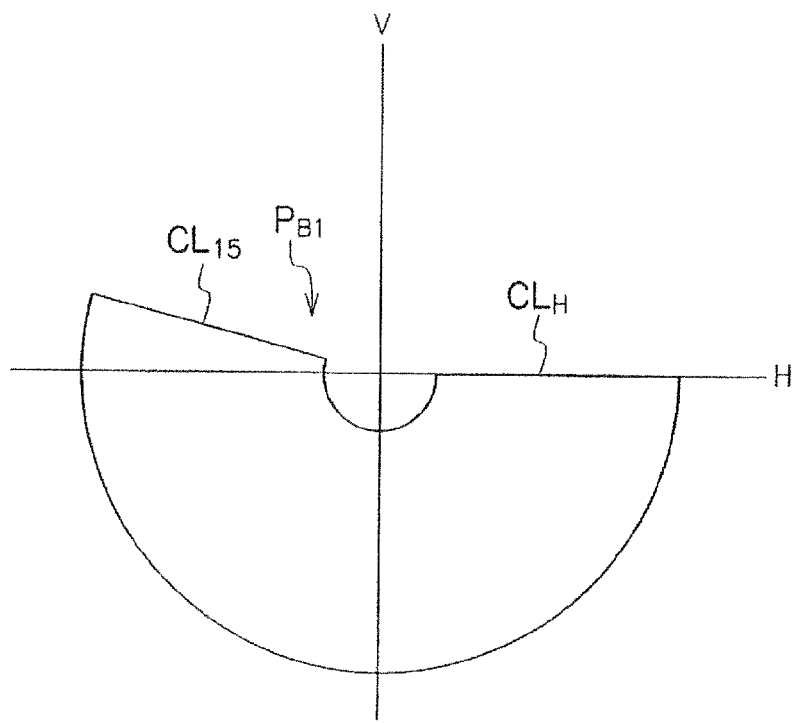
FIG. 12B shows an example of a light distribution pattern formed by the vehicle lighting device shown in FIG. 12A.

FIG. 12A is a plan view of a reflector-type (see FIG. 10) vehicle lighting device 90d including a light source apparatus including the wavelength conversion structure 20d viewed from the light projection direction. The light that exits from the range corresponding to the angle θ1 (=195°) between the first flat plane P1 and the second flat plane P2 or the range within which the phosphor-containing resin 24d is formed irradiates the reflection surfaces 91 and 92, which guide the light forward in the light projection direction. Since the region where no phosphor-containing resin 24d is formed has instead the light reflecting film 26 formed thereon, an image B1 (hatched in FIG. 12A) of the light that exits from the wavelength conversion structure 20d and irradiates the reflection surfaces 91 and 92 has a shape corresponding to the region where the phosphor-containing resin 24d is formed. The light reflected by the reflection surfaces 91 and 92 is projected on an imaginary vertical screen and forms a horizontally and vertically inverted optical image B1, as shown in FIG. 12B. A low beam light distribution pattern $P_{B1}$ containing a horizontal cutoff line $CL_H$ and a 15°-oblique cutoff line $CL_{15}$ is thus formed.

Since the light source apparatus used in the thus configured vehicle lighting device 90d has a compact configuration in which the wavelength conversion structure 20d and the laser diode 10 are disposed adjacent to each other on the heat sink base 30, the vehicle lighting device 90d not only has a compact structure having a smaller size in the optical axis direction than related art but also provides the eye safety function.

Sixth Embodiment

Figure 13:
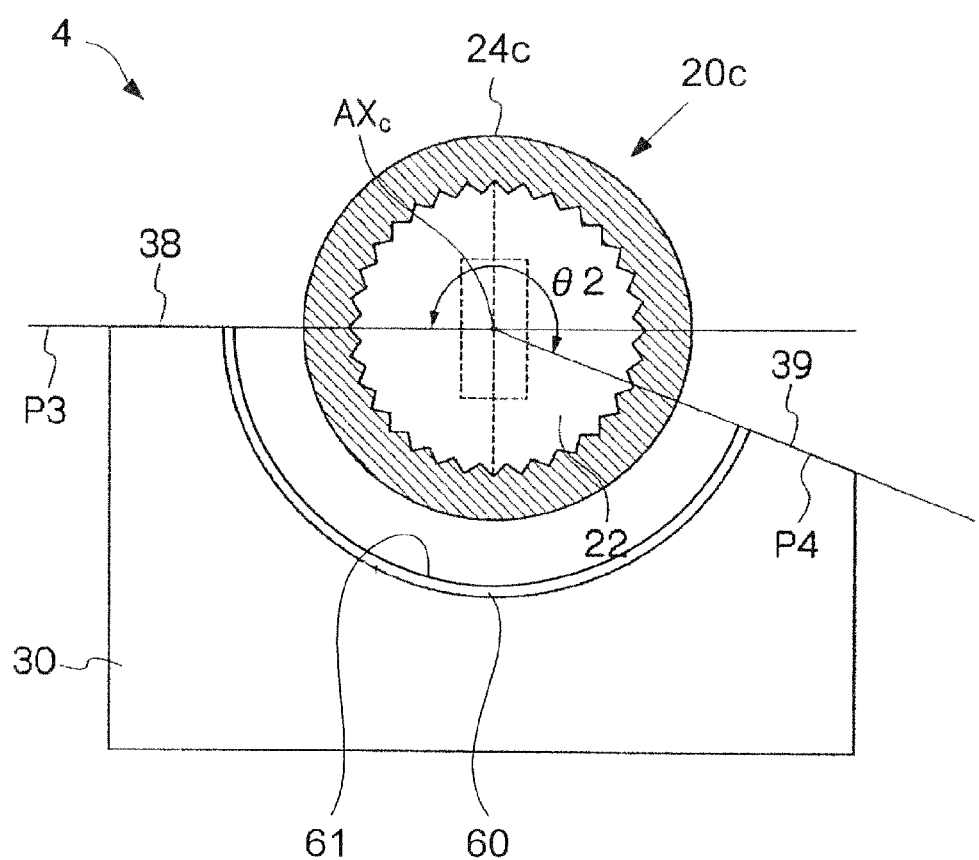
FIG. 13 is a cross-sectional view showing the configuration of a light source apparatus according to a sixth embodiment of the invention.

FIG. 13 shows the configuration of a light source apparatus 4 according to a sixth embodiment of the invention and is a cross-sectional view showing a cross section perpendicular to the cylinder axis of the light guide 22. The light source apparatus 4 includes a reflector 60 formed integrally with the heat sink base 30 and disposed under the wavelength conversion structure 20c, as in the light source apparatus 2 according to the third embodiment (see FIG. 8B). The reflector 60 is formed by forming a light reflecting film 61 on a curved surface along the outer edge of the wavelength conversion structure 20c. The heat sink base 30 has a horizontal surface 38 cut along a third flat plane P3 (horizontal plane) containing the cylinder axis $AX_c$ of the light guide 22 and an inclined surface 39 cut along a fourth flat plane P4 containing the cylinder axis $AX_c$ of the light guide 22 and inclined to the third flat plane P3 by θ2 (=195°). The light reflecting film 61, which forms the reflector 60, is disposed between the horizontal surface 38 and the inclined surface 39. The light reflecting film 61 is provided in a position away from the outer circumferential surface of the wavelength conversion structure 20c (surface of the phosphor-containing resin 24c that covers the side surface of the light guide 22) and guides the light that exits from the wavelength conversion structure 20c upward.

The wavelength conversion structure 20c has the phosphor-containing resin 24c, which is formed within a range corresponding to a central angle of 360° along the side surface of the light guide 22, as in the third embodiment. The portion of the wavelength conversion structure 20c on the side where the laser light incident facet is present is so inserted into the fixed ring 31 that the wavelength conversion structure 20c is located adjacent to the laser diode and fixed like a cantilever with the laser light incident port facing the laser light exiting facet.

In the configuration of the light source apparatus 4 according to the present embodiment, the light exiting from the wavelength conversion structure 20c and directed downward is blocked within the range where the reflector 60 faces the light exiting surface of the wavelength conversion structure 20c. In a vehicle lighting device including the light source apparatus 4, the light distribution can be controlled by changing the angle θ2 between the third flat plane P3 and the fourth flat plane P4, which define the light blocking range.

Figure 14A:
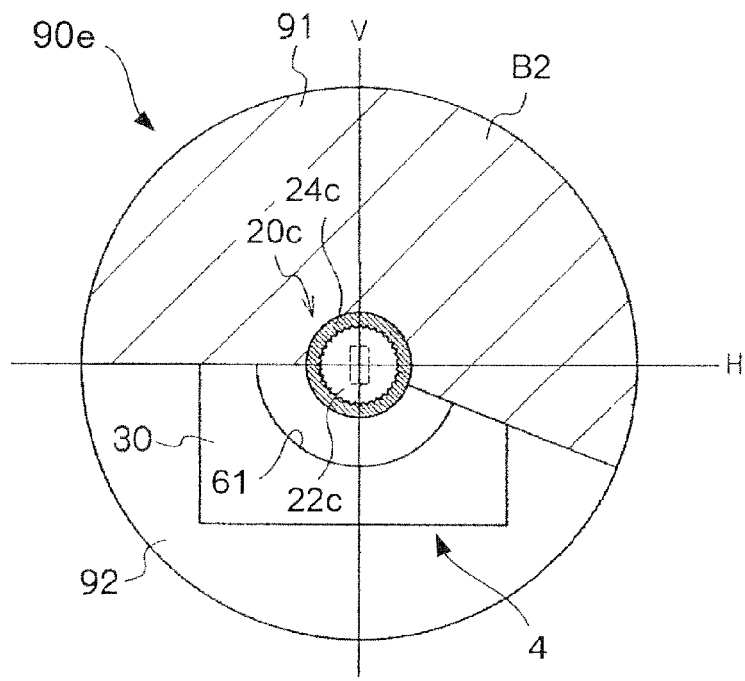
FIG. 14A is a front view showing the configuration of a vehicle lighting device including the light source apparatus according to the sixth embodiment of the invention.
Figure 14B:
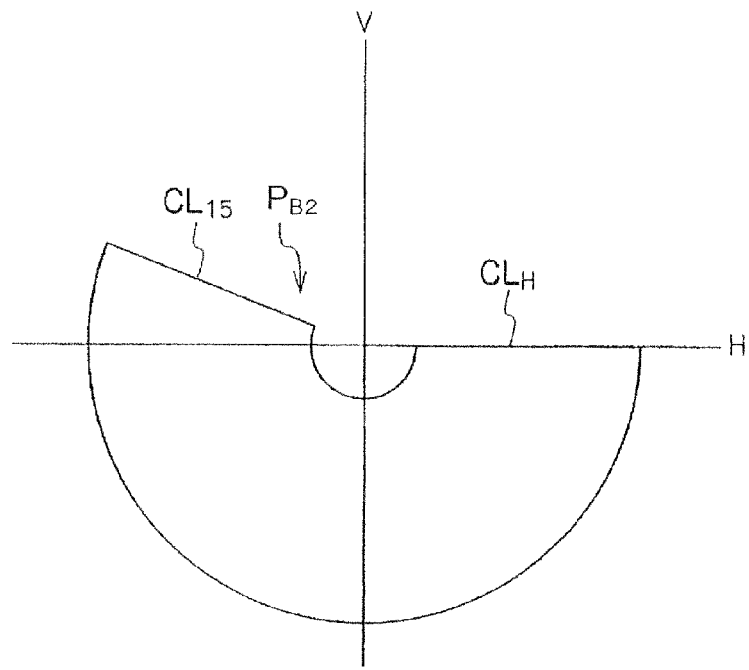
FIG. 14B shows an example of a light distribution pattern formed by the vehicle lighting device shown in FIG. 14A.

FIG. 14A is a plan view of a reflector-type (see FIG. 10) vehicle lighting device 90e including the light source apparatus 4 viewed from the light projection direction. An image B2 (hatched in FIG. 14A) of the light exiting from the wavelength conversion structure 20c and irradiating the reflection surfaces 91 and 92 has a shape corresponding to the angle θ2 (=195°) between the third flat plane P3 and the fourth flat plane P4. The light reflected by the reflection surfaces 91 and 92 is projected on an imaginary vertical screen and forms a horizontally and vertically inverted optical image B2, as shown in FIG. 14B. A low beam light distribution pattern $P_{B2}$ containing a horizontal cutoff line $CL_H$ and a 15°-oblique cutoff line $CL_{15}$ is thus formed. As shown by the 15°-oblique cutoff line $CL_{15}$, there exists light directed downward below the horizontal plane passing through the cylinder axis $AX_c$ of the light guide 22, but the light guide 22 and the reflector 60 are disposed on the upper surface of a raised portion of the heat sink base 30, part of which is convexly shaped, as shown in FIG. 1, whereby the light source apparatus itself will not block light. Further, since the phosphor-containing resin 24c may be formed within a range corresponding to a central angle of 360° around the cylinder axis, it is unnecessary to precisely control the range within which the phosphor-containing resin 24c is formed, whereby the light source apparatus can be readily manufactured.

In each of the embodiments described above, the phosphor-containing resin is formed in a specific limited range, but the phosphor-containing resin is not necessarily formed this way. The range within which the phosphor-containing resin is formed, that is, the range of the light emitting portion, can be changed as appropriate in accordance with light distribution design in the light source apparatus.

The invention has been described with reference to the preferred embodiments thereof. It should be understood by those skilled in the art that a variety of alterations and modifications may be made from the embodiments described above. It is therefore contemplated that the appended claims encompass all such alterations and modifications.

This application is based on Japanese Patent Application Nos. 2010-188333 and 2011-127327 which are hereby incorporated by reference.

What is claimed is:

1. A wavelength conversion structure into which laser light is introduced and which outputs light having a wavelength different from a wavelength of said laser light, the wavelength conversion structure comprising:
   a light guide formed of a light-transmissive member and having a laser light incident port that allows said laser light to be introduced therein; and
   a phosphor-containing layer that covers at least a part of a surface of said light guide,
   wherein said light guide has a light diffusing structure having asperities and a light reflecting film, wherein said asperities are formed over the surface of said light guide except a laser light incident surface having said laser light incident port, and wherein said light reflecting film is formed over the surface of said light guide having said asperities except said laser light incident port and a portion which is covered with said phosphor-containing layer, and
   wherein said phosphor-containing layer forms a light extracting surface that converts said wavelength of said laser light introduced into said light guide and that allows the converted light to exit out of said wavelength conversion structure.

2. The wavelength conversion structure according to claim 1, wherein said light guide has the asperities at the portion covered with said phosphor-containing layer, and each of a plurality of projections that form said asperities has a vertex angle of 90° or smaller.

3. The wavelength conversion structure according to claim 1, wherein said light guide has a cylindrical shape, and said phosphor-containing layer is provided along a side surface of said cylindrical shape.

4. The wavelength conversion structure according to claim 1, further comprising a polarization film provided adjacent to said laser light incident surface of said light guide.

5. The wavelength conversion structure according to claim 1, further comprising an anti-reflection film provided adjacent to said laser light incident surface of said light guide, wherein said anti-reflection film is formed by alternately stacking two layers having different refractive indices.

6. A light source apparatus comprising:
   the wavelength conversion structure of claim 1; and
   a semiconductor laser provided adjacent to said wavelength conversion structure, wherein said semiconductor laser is disposed such that a laser light exiting surface thereof faces said laser light incident port.

7. A method for manufacturing the wavelength conversion structure according to claim 1, the method comprising:
   providing the light-transmissive member that forms said light guide;
   forming the asperities over the surface of said light-transmissive member except a surface that forms said laser light incident surface;
   forming the light reflecting film over the surface of said light guide having said asperities except portions where said laser light incident port and said phosphor-containing layer are formed; and
   forming said phosphor-containing layer to cover an exposed surface of said light-transmissive member that is not covered with said light reflecting film.

8. A light source apparatus comprising:
   the wavelength conversion structure according to claim 3; and
   a heat sink base on which said wavelength conversion structure and a semiconductor laser are mounted adjacent to each other, wherein said heat sink base has a light reflecting surface provided in a position away from the side surface of said wavelength conversion structure.

9. A light source apparatus comprising:
   the wavelength conversion structure according to claim 3; and
   a semiconductor laser provided adjacent to said wavelength conversion structure, wherein said semiconductor laser is so disposed that a laser light exiting surface thereof faces said laser light incident port, wherein said light guide has the cylindrical shape having a diameter greater than or equal to 0.3 mm but smaller than or equal to 2.0 mm and a length greater than or equal to 0.3 mm but smaller than or equal to 6.0 mm with said length being greater than said diameter, and wherein a range within which said phosphor-containing layer covers the side surface of said light guide is surrounded by a first flat plane containing a cylinder axis of said light guide and a second flat plane that also contains the cylinder axis of said light guide and that is inclined to said first flat plane by a predetermined angle of 195°.

* * * * *